(12) United States Patent
Tang et al.

(10) Patent No.: US 8,557,094 B2
(45) Date of Patent: Oct. 15, 2013

(54) SPUTTERING CHAMBER HAVING AUXILIARY BACKSIDE MAGNET TO IMPROVE ETCH UNIFORMITY AND MAGNETRON PRODUCING SUSTAINED SELF SPUTTERING OF RUTHENIUM AND TANTALUM

(75) Inventors: Xianmin Tang, San Jose, CA (US); Hua Chung, San Jose, CA (US); Rongjun Wang, Cupertino, CA (US); Tza-Jing Gung, San Jose, CA (US); Praburam Gopalraja, San Jose, CA (US); Jick Yu, San Jose, CA (US); Hong Yang, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1366 days.

(21) Appl. No.: 11/689,720

(22) Filed: Mar. 22, 2007

(65) Prior Publication Data

US 2008/0083610 A1  Apr. 10, 2008

Related U.S. Application Data

(60) Provisional application No. 60/849,730, filed on Oct. 5, 2006.

(51) Int. Cl.
*C23C 14/34* (2006.01)

(52) U.S. Cl.
USPC .................................. 204/298.2; 204/298.19

(58) Field of Classification Search
USPC ................ 204/298.16, 298.19, 298.2, 298.17
See application file for complete search history.

(56) References Cited

U.S. PATENT DOCUMENTS

| 4,746,417 | A  | * | 5/1988  | Ferenbach et al. ......... 204/298.2 |
| 5,164,063 | A  | * | 11/1992 | Braeuer et al. ............ 204/298.2 |
| 6,440,282 | B1 | * | 8/2002  | Wada et al. ................ 204/298.2 |
| 6,491,801 | B1 | * | 12/2002 | Gung ......................... 204/298.2 |
| 6,497,802 | B2 |   | 12/2002 | Fu ............................. 204/298.2 |
| 6,692,617 | B1 |   | 2/2004  | Fu et al. ................... 204/192.12 |
| 6,723,215 | B2 | * | 4/2004  | Park et al. ................. 204/298.2 |
| 7,119,489 | B2 | * | 10/2006 | Shin et al. ................. 315/39.51 |
| 7,169,271 | B2 | * | 1/2007  | Hong et al. ............... 204/298.2 |
| 7,585,399 | B1 | * | 9/2009  | Lai et al. .................. 204/298.16 |
| 7,718,042 | B2 | * | 5/2010  | Kadlec et al. ............ 204/192.12 |
| 2002/0008017 | A1 | * | 1/2002 | Fu ............................ 204/192.17 |
| 2005/0211548 | A1 |   | 9/2005 | Gung et al. .............. 204/192.12 |
| 2006/0060470 | A1 |   | 3/2006 | Gung ........................ 204/298.2 |
| 2006/0076232 | A1 |   | 4/2006 | Miller et al. ............. 204/192.12 |
| 2006/0251872 | A1 |   | 11/2006 | Wang et al. .................. 428/209 |

OTHER PUBLICATIONS

Posadowski W.M., Sustained self sputtering of different materials using dc magnetron, Vacuum, vol. 46, p. 1017-1020 (1995).*

* cited by examiner

*Primary Examiner* — John Brayton
(74) *Attorney, Agent, or Firm* — Charles S. Guenzer (57) ABSTRACT

A plasma sputter chamber and process for sputtering ruthenium and tantalum at low pressure or with self-sustained sputtering (SSS). The source magnetron is strongly unbalanced and of sufficient size to project the unbalanced magnetic field toward the wafer to increase the ionization probability. Sputter etch uniformity is increased by the use of an auxiliary magnet system rotating with the source magnetron but placed towards the center of rotation. It may be a larger, nearly balanced auxiliary magnetron with an outer polarity matching that of the source magnetron or an array of magnets of that polarity. An integrated process includes a directional deposition of the refractory metal and its nitride, a sputter etch, and a flash deposition.

10 Claims, 11 Drawing Sheets

(Prior Art)

SPUTTERING CHAMBER HAVING AUXILIARY BACKSIDE MAGNET TO IMPROVE ETCH UNIFORMITY AND MAGNETRON PRODUCING SUSTAINED SELF SPUTTERING OF RUTHENIUM AND TANTALUM

RELATED APPLICATION

This application claims benefit of provisional application 60/849,730, filed Oct. 5, 2006.

FIELD OF THE INVENTION

The invention relates generally to sputtering of materials. In particular, the invention relates to the magnetic system used for magnetron sputtering.

BACKGROUND ART

Sputtering, alternatively called physical vapor deposition (PVD), is the most prevalent method of depositing layers of metals and related materials in the fabrication of integrated circuit. One important application is the sputtering of barriers and other liner layers on the sides of high aspect-ratio via holes. One method of achieving deep penetration into the via hole is to produce a high ionization fraction of sputtered atoms, that is, a high fraction of ions in the sputter flux, and to RF bias the wafer to attract the ions deep within the hole. Similar techniques are used to sputter etch somewhat resistive barrier material at the bottom of the via with the accelerated metal or argon working gas ions or somewhat equivalently to balance the sputter etching and sputter deposition at the bottom of the via while primarily sputter depositing on the via sides.

Figure 1:
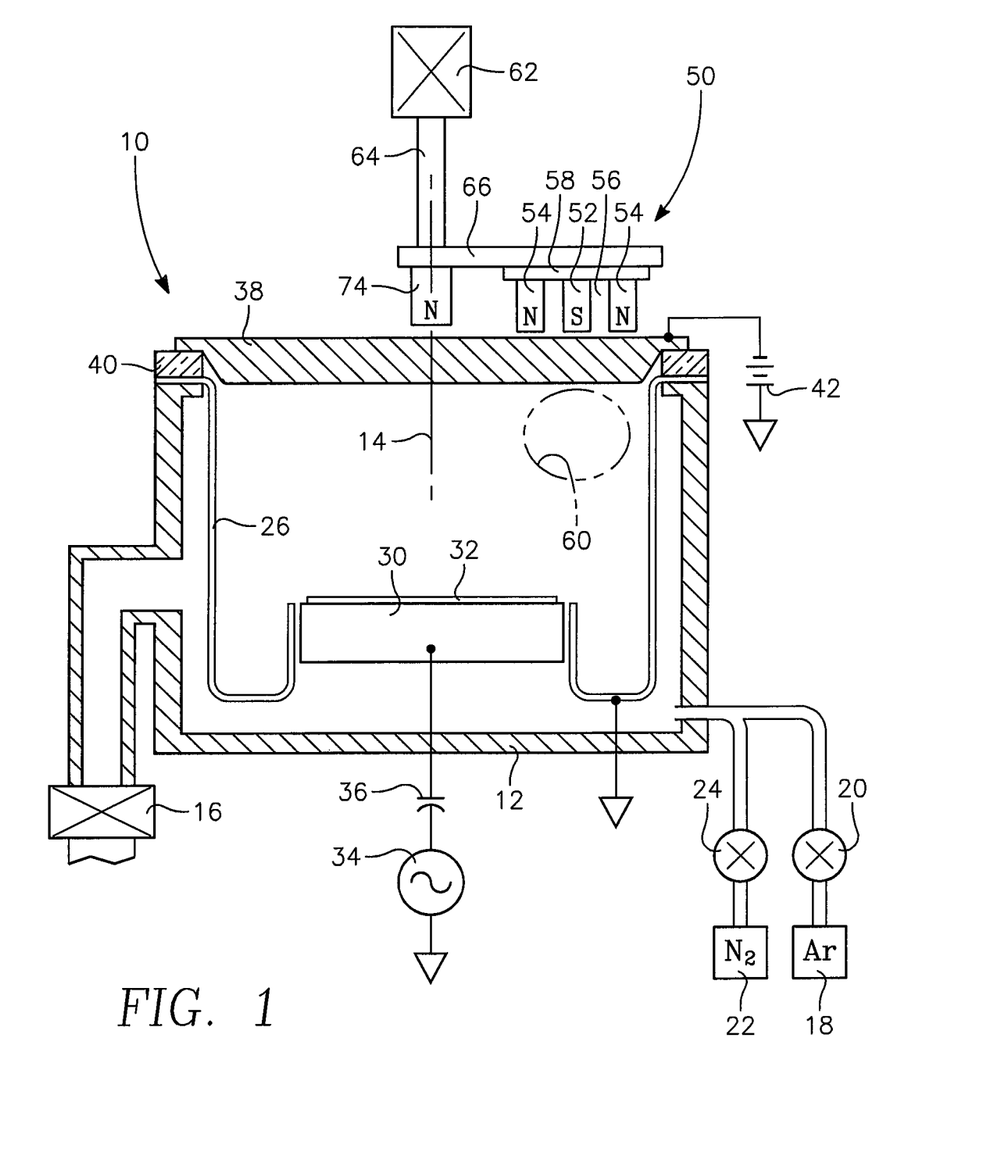
FIG. 1 is a cross-sectional view of a sputter chamber incorporating some features of the invention.

A magnetron sputter chamber 10 illustrated schematically in cross section in FIG. 1 can effectively sputter thin films of the refractory metals Ta, Ru, or RuTa or their respective nitrides into holes having high aspect ratios and can further act to plasma clean the substrate and selectively etch portions of the deposited refractory-based films. Sputtering of copper seed layers can similarly be effected. The sputter chamber 10 includes a vacuum chamber 12 arranged generally symmetrically about a central axis 14. A vacuum pump system 16 pumps the vacuum chamber 12 to a very low base pressure in the range of $10^{-6}$ Torr. However, an argon gas source 18 connected to the chamber through a mass flow controller 20 supplies argon as a sputter working gas. The argon pressure inside the vacuum chamber 12 is typically held in the low milliTorr to high sub-milliTorr range at least during ignition of the plasma. A nitrogen gas source 22 supplies nitrogen gas into the vacuum chamber 12 through another mass flow controller 24 when a refractory nitride is being deposited. An electrically grounded shield 26 protects the chamber walls from sputter deposition and also acts as the anode in generating the plasma.

A pedestal 30 arranged about the central axis 14 holds a wafer 32 or other substrate to be sputter coated. An unillustrated clamp ring or electrostatic chuck may be used to hold the wafer 32 to the pedestal 30. An RF power supply 34 supplies RF power through a capacitive coupling circuit 36 to the pedestal 30, which is conductive and act as an electrode. In the presence of a plasma, the RF biased pedestal 30 develops a negative DC bias, which is effective at attracting and accelerating positive ions in the plasma whether refractory metal or argon ions. The grounded shield 26 is cup-shaped to also protect the sides of the pedestal 30 from sputter deposition. A target 38 is arranged in opposition to the pedestal 30 and is vacuum sealed to the vacuum chamber 12 through an isolator 40. At least the front surface of the target 38 is composed of a metallic material to be deposited on the wafer 32, in this case, ruthenium, tantalum, or a ruthenium tantalum alloy. For a copper seed layer, the target 38 is composed principally of copper.

A DC power supply 42 electrically biases the target 38 to a negative voltage with respect to the grounded shield 26 to cause the argon to discharge into a plasma such that the positively charged argon ions are attracted to the negatively biased target 38 and sputter tantalum or ruthenium atoms from it, some of which fall upon the wafer 32 and deposit a layer of the refractory target material on it. In reactive sputtering, reactive nitrogen gas is additionally admitted from the nitrogen gas source 18 into the chamber 12 to react with the tantalum or ruthenium being sputtered to cause the deposition of a refractory metal nitride layer on the wafer 32.

Although some advanced sputter chambers include an RF inductive coil to increase the plasma density or to generate an argon plasma for sputtering, none is used here in the described embodiment of the chamber.

The target sputtering rate and sputter ionization fraction of the sputtered atoms can be greatly increased by placing a magnetron 50 is back of the target 38. The magnetron 50 preferably is small, strong, and unbalanced. The smallness and strength increase the ionization fraction and the imbalance projects a magnet field into the processing region for at least two effects of guiding sputtered ions to the wafer and reducing plasma loss to the walls. Such a magnetron includes an inner pole 52 of one magnetic polarity along the central axis and an outer pole 54 which surrounds the inner pole 52 of the opposite magnetic polarity and separated from the outer pole 54 by an annular gap 56. The poles 52, 54 are supported at their backs by a magnetic yoke 58, which magnetically couples them.

The magnetic field extending between the poles 52, 54 in front of the target 38 creates a high-density plasma region 60 adjacent the front face of the target 38, which greatly increases the sputtering rate. The high-density plasma region 60 generally follows the annular gap 56 and hence forms as a closed plasma track having no end loss. Conventionally, the high-density plasma region 60 is relatively shallow and confined to near the target 38. Some aspects of the invention concern the size and shape of the high-density plasma region 60. The magnetron 50 is unbalanced in the sense that the total magnetic intensity of the outer pole 54, that is, the magnetic flux integrated over its area, is substantially greater than that of the inner pole, for example, by a factor of two or more. The unbalanced magnetic field projects from the target 38 toward the wafer 32 to extend the plasma and to guide sputtered ions to the wafer 32 and reduce plasma diffusion to the sides.

Early versions of the magnetron 50 were typically formed in a triangular shape, that is, asymmetrical about the central axis 14. A motor 62 drives a rotary shaft 64 extending along the central axis 14 and fixed to a rotation arm 66 supporting the yoke 58 and the magnetic poles 52, 54 to rotate the magnetron 50 about the central axis 14 and produce an azimuthally uniform time-averaged magnetic field. However, later versions of the magnetron 50 have a substantially circular shape and a small size relative to the target and they are often placed to overlie the outer portions of the wafer 32. Magnetron systems are known in which the radial position of the magnetron can be varied between different phases of the sputtering process and chamber cleaning as described by Gung et al. in U.S. patent application Ser. No. 10/949,735, filed Sep. 29, 2005 and published as U.S. Patent Application Publication 2005/0211548, incorporated herein by reference in its entirety.

Figure 2:
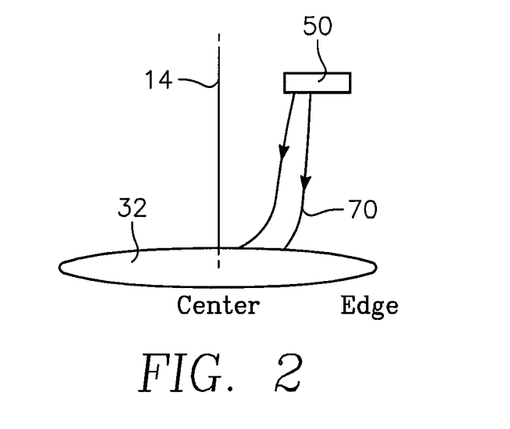
FIG. 2 is schematic side view illustrating the magnetic guidance field produced by a conventional unbalanced magnetron.
Figure 3:
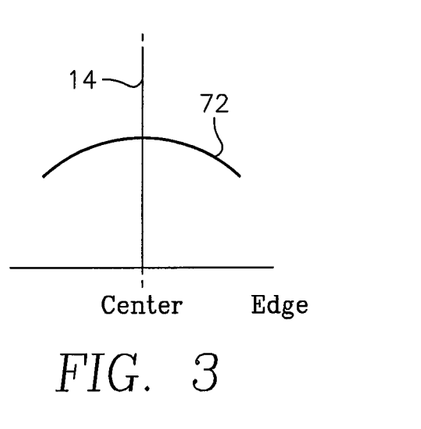
FIG. 3 is a graph illustrating the ion flux profile produced by the magnetron of FIG. 2.

For many liner applications, the magnetron 50 is small, as illustrated in the schematic view of FIG. 2, and located over the outer portion of the wafer 32. The unbalanced magnetic field 70 projecting from the magnetron 50 towards the wafer 32 tends to guide the ions towards the center 14 of the wafer. As a result, a typical ion flux profile 72 illustrated in FIG. 3 tends to be distinctly heavier at the center. Whether for sputter deposition or sputter etching, the flux profile results in non-uniform deposition or etching. Furthermore, the guidance field 70 of FIG. 2 and hence the trajectories of the ion even after acceleration across the plasma sheath towards the biased wafer 32, tend to be more strongly angled near the wafer center 14 than at the wafer edge. Even if auxiliary magnetic coils or sidewall magnets or magnets under the wafer can even out the ion flux profile 72, the angular non-uniformity introduced by the guidance field 70 results in sidewall asymmetry and via bottom shielding.

SUMMARY OF THE INVENTION

Ruthenium and tantalum may be sputtered at very low pressures by use of a strongly unbalanced magnetron which projects the unbalanced magnetic field far into the chamber to increase the ionization probability to promote sputtering my metal ions. Sustained self-sputtering (SSS) with no sputter working gas is possible with ruthenium and tantalum and other metals not previously believed to be subject to SSS. The unbalance ratio may be greater than three or even higher.

The uniformity of sputter etching is improved by either an auxiliary magnetron or a magnet array rotating with the source magnetron and located in a direction towards the center of rotation of the source magnetron. The auxiliary magnetron is relatively large and nearly balanced, that is, having an imbalance ratio of less than 1.5. Its outer pole has the same polarity as the outer pole of the source magnetron. Advantageously, the auxiliary magnetron covers the center of rotation and extends as far radially outward as the source magnetron. The alternative magnet array may be an array of magnets arranged in an arc shape and having the polarity of the outer pole of the source magnetron.

A magnetron capable of self-sustained sputtering of ruthenium, tantalum, and other metals not previously thought capable of it includes a gap and shape tailored for creating a magnetic field distribution supporting such self-sustained sputtering. The shape may be oblong along the direction of rotation.

Ruthenium, tantalum, and their alloys may be deposited as a liner layer in a high-aspect ratio hole by a sequence performed in a plasma sputter chamber of direction sputter deposition, preferably with a high fraction of ionized sputter atoms, an argon etch, and a more isotropic sputter deposition. The first deposition step may include deposition of both the metal and of the metal nitride.

DETAILED DESCRIPTION OF THE PREFERRED EMBODIMENTS

In one aspect of the invention, as illustrated in FIG. 1, an auxiliary magnet 74 is supported on the rotation arm 66 generally near the rotation axis 14 or on the opposite side of it from the magnetron 50. It preferably has a magnetic polarity at least near the magnetron 50 which is the same as the adjacent strong outer pole 54. The auxiliary magnet 74 may be in the form of a second magnetron magnetically decoupled from the magnetron 50, which acts as a source magnetron.

Figure 4:
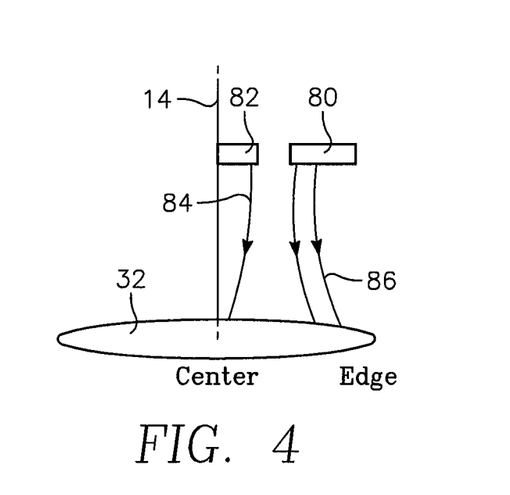
FIG. 4 is a schematic side view illustrating the magnetic guidance field produced by a unbalanced magnetron and a auxiliary magnet according to one aspect of the invention.
Figure 5:
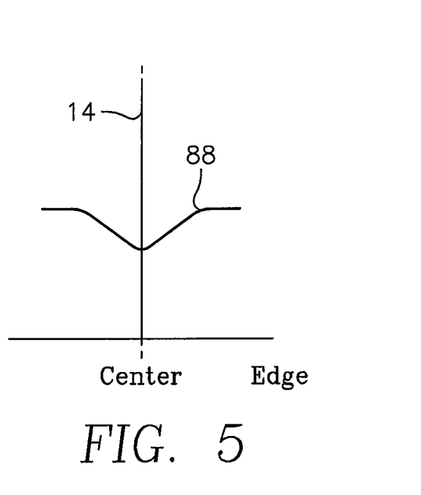
FIG. 5 is graph illustrating the ion flux profile produced by one embodiment of the magnetron and auxiliary magnet of FIG. 4.

As schematically illustrated in FIG. 4, a small source magnetron 80 is positioned nearly over the edge of the wafer 32 and rotated about the central axis 14. It may have a high unbalance ratio, for example, at least 3:1 and 6:1 may be more advantageous. The unbalance ratio is a measure of the fact that the total magnetic intensity of the outer magnetic pole is greater than the total magnetic intensity of the opposed inner magnetic pole by a factor of the unbalance ratio. Additionally, an auxiliary magnet 82 is located nearer the central axis 14 or on the opposite side of the central axis 14 and has the same magnetic polarity as the outer pole of the source magnetron 80 to produce a projecting auxiliary magnetic field 84 extending towards the wafer 32 close to the central axis 14 in a partially parallel direction to a guidance magnetic field 86 from the source magnetron 80. The magnetic fields 84, 86 linearly combine, but effectively the center magnetic field 84 tends to repel the source guidance field 86. The center auxiliary magnet 82 aligned with the outer pole of the source magnetron 80 can produce a radial ion flux profile 88, as illustrated in the graph of FIG. 5, that is light near the center 14 even with zero wafer bias power. By proper design of and balanced between the source magnetron 80 and the auxiliary magnet 82, a substantially flat radial ion flux profile can be obtained even with zero wafer bias power.

Figure 6:
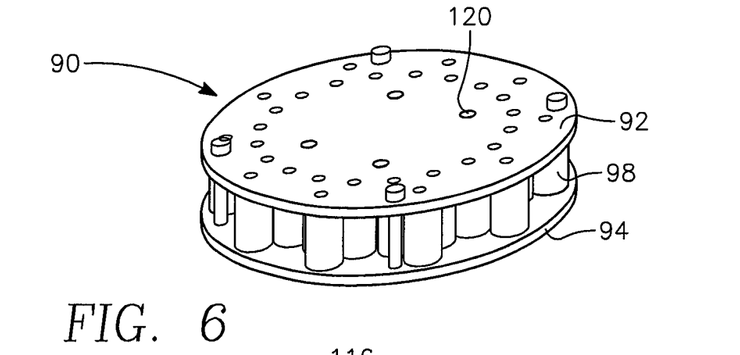
FIG. 6 is an orthographic view of an inventive magnetron which promotes self-sustained sputtering.
Figure 7:
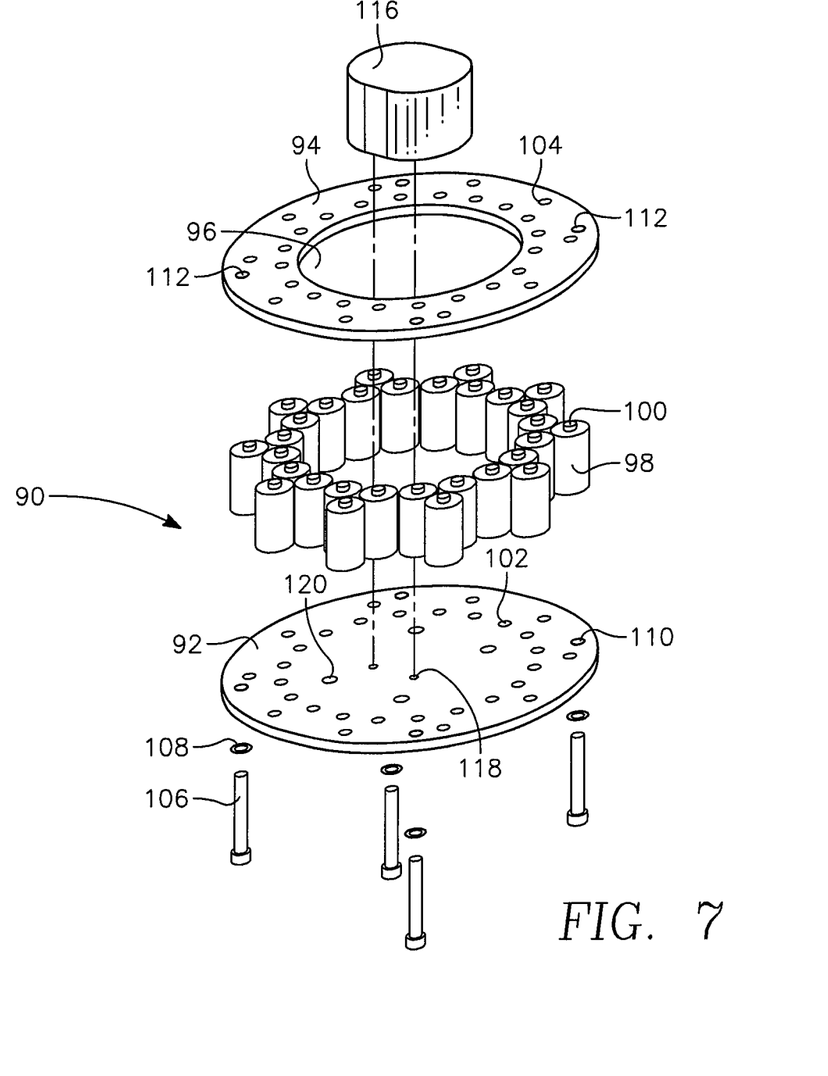
FIG. 7 is an orthographic view of the magnetron of FIG. 6.
Figure 8:
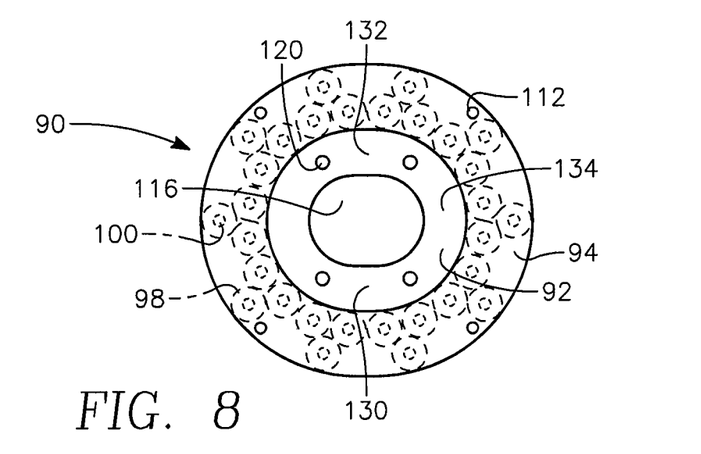
FIG. 8 is a bottom plan view of the magnetron of FIGS. 6 and 7.

An advantageous source magnetron 90, referred to as the MUT magnetron, is illustrated in the orthographic assembled view of FIG. 6, the orthographic exploded view of FIG. 7, and the bottom plan view of FIG. 8 when viewed in its operational orientation. The magnetron 90 includes a magnetic yoke plate 92 and an annular magnetic pole face 94 having a central aperture 96. The yoke plate 92 and pole face 94 capture between them a large number, 24 in the illustrated embodiment, of cylindrical magnets 98 of the same magnetic polarity and encased in canisters having pins 100 on either end to be caught in corresponding holes 102, 104 in the yoke plate 92 and pole face 94. Screws 106 having associated lock washers 108 pass through pass holes 110 in the yoke plate 92 and screw into tapped holes 112 in the pole face 94 to fix together the yoke plate 92 and the pole face 94 with the magnets 98 caught between them. A center pole 116 includes an assembly of a solid nearly cylindrical magnet and an integrated pole piece of height approximately equal to that of the sum of the magnets 98 and the face plate 94 is also fixed to the yoke plate 90 at the center of the aperture 96 of the pole piece 94 by unillustrated screws passing through holes 118 in the yoke plate 92. The solid inner magnet maximizes the magnetic intensity of the inner pole.

Figure 9:
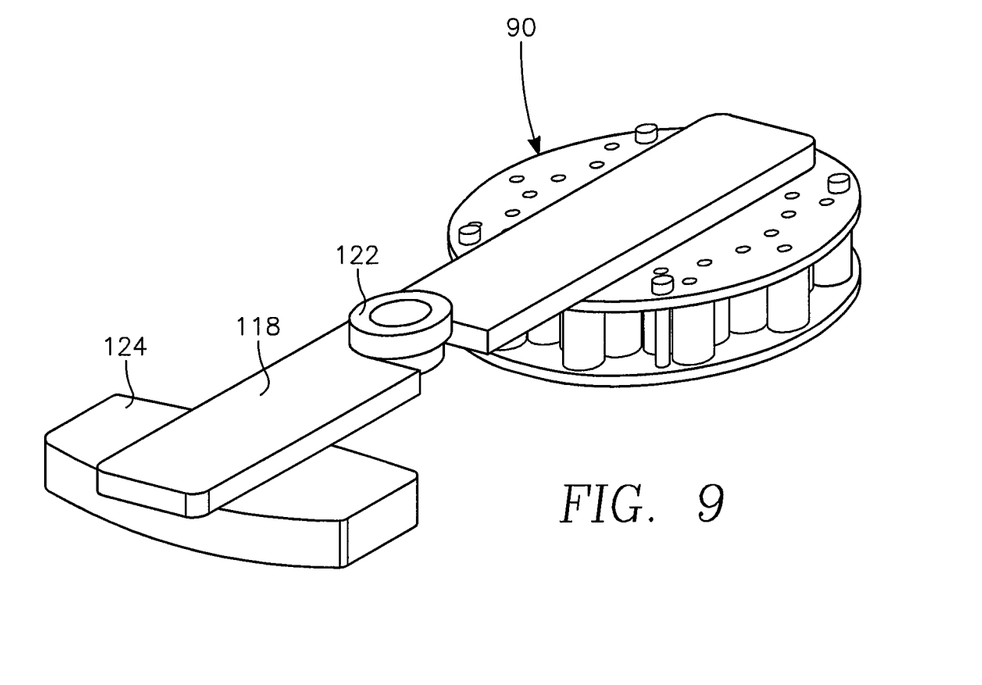
FIG. 9 is an orthographic view showing a rotation arm mounting the magnetron of FIG. 6 and a counterbalance.

The source magnetron 90 is fixed to a preferably nonmagnetic rotation arm 118, illustrated in the orthographic view of FIG. 9, by unillustrated screws passing through countersunk pass holes 120 in the yoke plate 92. A clamp 122 fixes the rotation arm 118 to the rotation shaft 64 of FIG. 1. The embodiment of FIG. 9 lacks an auxiliary magneton. Instead, a counterweight 124 is also fixed to the rotation arm 118 on the opposite side of the shaft clamp 122 from the magnetron 90 to balance the torque on the rotation shaft 64. This embodiment may be used for self-sustained sputtering of many materials in situations where uniformity is less of an issue for the magnetron.

A magnetic circuit is formed in the MUT magnetron 90 by the pole piece 94, magnets 98, yoke plate 92, and center pole 116 with a closed gap 130 or loop between them. The magnetic polarity of the center pole 116 is opposite that of the pole piece 94. Returning to FIG. 8, the magnetic field across the gap 130 establishes a plasma loop on the sputtering side of the target 38 of FIG. 1 and thus defines the high-density plasma region 60. The annular arrangement of the magnets 98 may be circular but preferably the arrangement defined by the aperture 96 in the pole face 94 is somewhat flattened or oval or a circular shape deformed somewhat to have arc-shaped lateral sides arced around the rotation axis 14 with a major (longer) axis being about 15 or 20% larger than a minor (shorter) axis. The major axis is arranged along the circumferential rotation path and the minor axis is arranged along a radius from the central axis 14. For example, the gap 130 may include two straight portions 132 perpendicular to the rotation arm joined by two semi-circular portions 134. The gap 130 maintains a nearly constant width if the center pole 116 has a non-circular shaped flattened along the rotation circumference. In the illustrated embodiment, the magnets 98 are arranged in a nearly continuous inner annular pattern and a sporadic outer annular pattern. Depending on the desired magnetic field and the strength of the magnets, some or all of the outer magnets 98 may be removed or more added. The combination of the solid inner magnet 116 and the array of outer magnets 98 arranged in more than a single row produces a strong radial magnetic field because of the density of magnets and a strong axial magnetic field because of the high imbalance ratio, which has a value of 3.6 in the tested embodiment.

A self-sustained sputtering must meet certain conditions. Fu et al. have explained self-sustained sputtering in U.S. Pat. No. 6,692,617 following the teachings of Posadowksi et al., "Sustained self-sputtering using a direct current magnetron source," *Journal of Vacuum Science and Technology A*, vol. 11, no. 6, November/December 1993, pp. 2980-2984 or Hosokawa et al. *Proceedings of the 3th International Vacuum Congress* (LeVide, Cannes, 1980). The condition for achieving self-sustained sputtering is $$\alpha \cdot \beta \cdot S_m \geq 1,$$

where $\alpha$ is the ionization ratio of sputtered target atoms, $\beta$ is the fraction of sputtered ions that return to the target, and $S_m$ is the self-sputtering yield, that is, the number of atoms sputtered by each returning sputtered ion. The condition is alternatively expressed as $$S_m \geq \frac{1}{\alpha \cdot \beta}.$$

The two parameters $\alpha, \beta$ are necessarily less than unity. In the past, it was felt that these parameters were sufficiently small that only a few materials had a sufficiently high self-sputtering yield $S_m$, namely, Cu, Pd, Pt, Ag, and Au. We believe that if the ionization ratio is increased the threshold value for self-sputtering yield threshold can be relaxed to about

$$S_m > 2$$

Further, a threshold plasma density is required for efficient ionization of secondary neutrals to achieve self-sustained sputtering. This threshold value depends on the magnetic field strength and the configuration of the magnetron. A neutral sputtered atom may be ionized during its passage through the plasma to the anode. The ionization may occur during three types of collisions: (1) exited neutral with neutral; (2) ion with neutral; and (3) electron with neutral. In a conventional low-density plasmas, ionization primarily arises in the Penning process, that is, in a neutral-neutral interaction between an excited argon Ar* and a neutral metal M according to the reaction $$Ar^* + M \rightarrow M^+ + e^- + Ar,$$

where $e^-$ is a negatively charged electron. However, in high-density plasmas and with a heavier metal such as Ru or Ta having a high cross-section for electronic collisions and lower ionization potentials, the electron-neutral collisions dominate according to the reaction $$M + e^- \rightarrow M^+ + 2e^-.$$

The mean free path L for the ionization of a neutral metal M ejected from the sputter target is given by $$L = \frac{v_M}{n \langle \sigma v \rangle},$$

where $v_M$ is the velocity of the metal neutral, n is the electron density, and $\sigma$ is the cross section for electron impact ionization. The product of the cross section $\sigma$ and the electron velocity v is integrated over a Maxwellian electron energy distribution. The higher the plasma density n, the shorter is the electron-ion mean free path. The larger the volume of the high-density discharge relative to the mean free path and thus the longer the residence time, the higher is the ionization probability. Accordingly, to achieve self-sustained sputtering, the plasma must not only be dense, it also must extend over a large volume. Alternatively stated, the magnetic field must be both strong and extend for a sizable distance away from the target.

Figure 10:
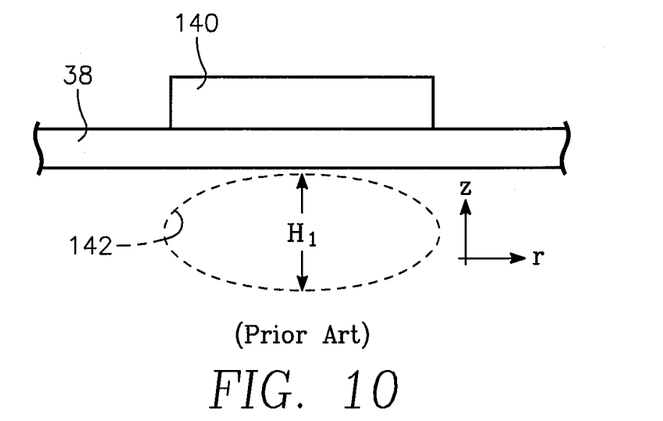
FIG. 10 is a cross-sectional view of a conventional magnetron and the region of high-density plasma it creates.
Figure 11:
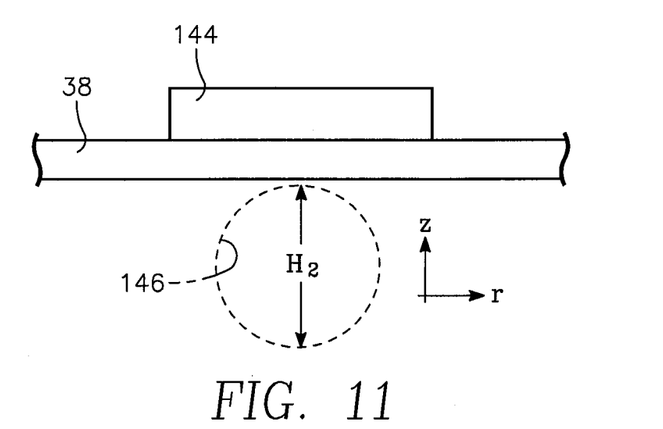
FIG. 11 is a cross-sectional view of an invention magnetron and the region of high-density plasma it creates.

These conditions can be visualized with reference to the schematic diagrams of FIGS. 10 and 11. In a conventional configuration illustrated in FIG. 10, a conventional magnetron 140 placed in back of the target 38 creates a high-density plasma region 142 having a depth $H_1$ and a plasma density $n_{e1}$. As a general rule, a high-density plasma region may be defined as the region in which the magnetic field B is at least 200 gauss. In a proposed configuration illustrated in FIG. 11, a magnetron 144 of the invention creates a high-density plasma region 146 having a depth $H_2$ and a plasma density $n_{e2}$. Because the magnetic field is used to trap electrons near the target 38, a stronger magnetic field $B_r$ in the radial direction r results in a higher plasma density. Hence it is desired that $$n_{e2} \gg n_{e1}$$

to produce a high ionization collision frequency. However, if the conventional high-density plasma region 142 is too shallow, for example, of depth $H_1$, the interaction length is too small relative to the mean free path L so that the total ionization probability is too low. Therefore, it is also important to produce a higher axial magnetic field $B_z$ in the vertical direction z to increase the depth of the high-density plasma region 146 to, that is, $H_2 > H_1$.

The strength of the magnets used in forming magnetrons is generally limited. The radial magnetic field $B_r$ may be increased by decreasing the gap between the opposed magnetic poles. However, reducing the gap does not increase the axial magnetic field $B_z$ and, in fact, tends to reduce it. Instead, a strong axial magnetic field $B_z$ can be achieved by increasing the imbalance between the two magnetic poles of the magnetron 144 so that the unbalanced portion of the magnetic field B from the stronger pole does not immediately return to the weaker pole but projects further away from the magnetron 144 before returning to the back of the stronger pole, thereby increasing the depth $H_1$. Fu in U.S. Pat. No. 6,497,802 has described using an imbalanced magnetron having a stronger outer pole to create a guiding magnetic field extending to the wafer. We believe the imbalance ratio needs to be even larger to create a self-sustaining plasma for heavy metals, for example, at least 3 and preferably even at least 6 or higher. A high imbalance ratio effectively reduces the lateral size of the high-density plasma region, thereby increasing the target power density and thus the density of the plasma and the ionization fraction. However, too high an imbalance ratio results in much higher target voltages, thus reducing the target life.

The metal ionization rate depends mainly on the electron density and the metal ionization probability. The longer the residence time of the unionized metal atom M inside the plasma region, the higher the probability that it will be ionized.

Figure 12:
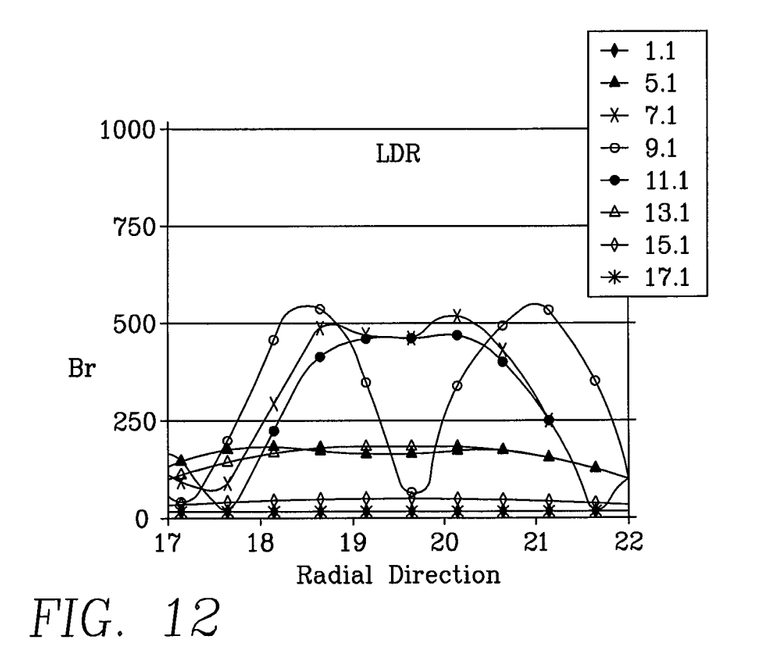
FIG. 12 is a graph of the radial magnetic field produced at different heights by a conventional magnetron.
Figure 13:
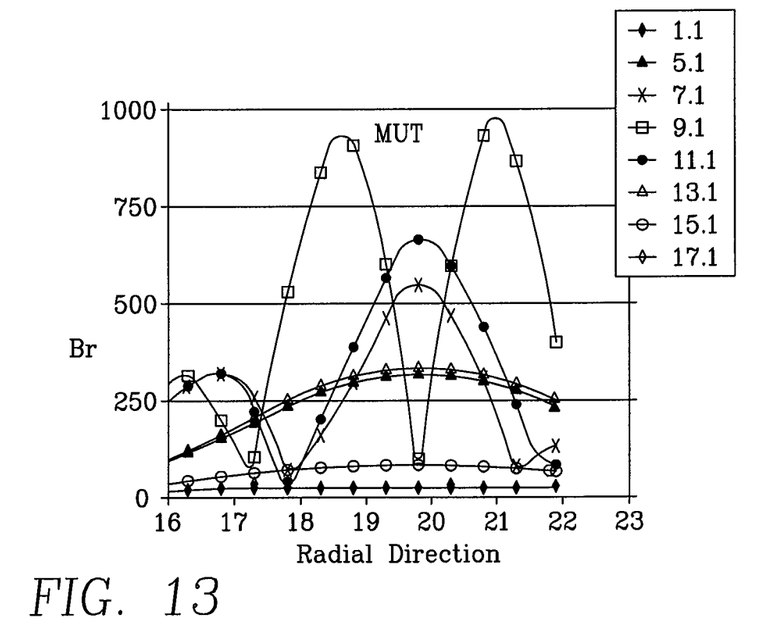
FIG. 13 is a graph of the radial magnetic field produced at different heights by a magnetron of FIG. 6.
Figure 14:
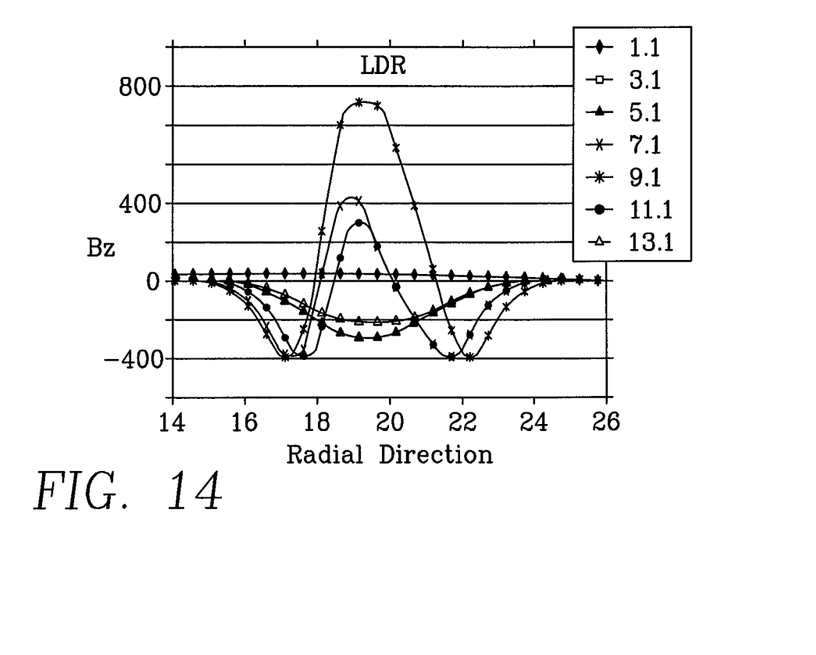
FIG. 14 is a graph of the axial magnetic filed produced at different heights by the conventional magnetron.
Figure 15:
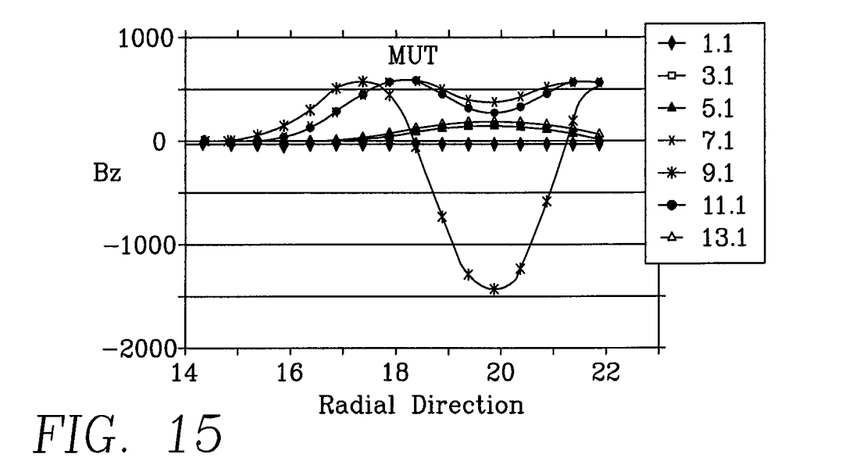
FIG. 15 is a graph of the axial magnetic field produced at different heights by the magnetron of FIG. 6.

Compared to the LDR magnetron described by Miller et al. in U.S. patent application Ser. No. 11/226,858, filed Sep. 14, 2005, now published as U.S. patent application publication 2006/0076232, the MUT magnetron of FIGS. 6-9, has a much stronger radial magnetic field $B_r$ and an extended plasma confinement region along the z-direction by about a factor of 1.4 as indicated by the plots of the radial magnetic field $B_r$ in FIGS. 12 and 13 for the LDR and MUT magnetrons respectively and the plots of the axial magnetic field $B_z$ in FIGS. 14 and 15, where the different curves are labeled with the height of the measurement along the axial direction away (below in the operational position) in the z-direction and plot the respective magnetic field as a function of the distance from the central axis 14. The magnetic field is expressed in units of gauss and both spatial dimensions are expressed in units of inches when measured on a test bed.

It has been found that the MUT magnetron 90 is capable of sustained self-sputtering (SSS) of ruthenium, ruthenium tantalum, or tantalum targets at relatively low target power levels. That is, once a plasma has been excited from the argon sputtering gas, the supply of argon may be terminated and the metal ions sputtered from the target are sufficient to continue to resputter the target. Sustained self-sputtering can operate at very low chamber pressures, well below 100 microTorr and down to essentially zero pressure, and produces a very high ionization fraction of sputtered metal ions. In our experiments, the plasma is struck at chamber pressure of 0.75 milliTorr from 4 sccm of argon process gas and 4 sccm of backside gas. After striking, the supply of argon process gas is discontinued so the chamber pressure is less than 0.5 milliTorr for effective self-sustained sputtering. Such self-sustained sputtering has been demonstrated with less than 25 kW of target power for a 300 mm tantalum target and less than 30 kW for a 300 mm RuTa target having a 90:10 atomic alloying ratio of ruthenium and tantalum. Under similar conditions with the MUT magnetron, sustained self-sputtering of a pure Ru target has been observed. Such SSS of Ta, Ru, and RuTa targets and targets of other metals previously not believed capable of SSS may be practiced without the auxiliary magnets for adjusting the sputtered ion profile. Tantalum being a heavy metal (atomic weight of 181) has a high resputtering yield but the vertical sectional size (width and height) of the plasma track needs to be increased to provide high ionization of the sputtered tantalum atom. As a result, a magnetron for tantalum SSS needs to be larger than those being currently used for SSS of copper (atomic weight of 63.5). Similar effects are expected for SSS of ruthenium (atomic weight of 101). The size of the gap between the poles of the magnetron determines both the horizontal width and the vertical thickness of the plasma confinement zone associated with the high-density plasma.

Although the inventive magnetron has been developed to achieve SSS or low-pressure sputtering of ruthenium and tantalum, it may be used for sputtering other metals not previously known to be subject to SSS.

The high plasma density over a large volume produced by the MUT magnetron enables the sputter chamber to be operated without the use of an RF coil in a sputter etch mode in which an argon plasma is used to sputter etch the wafer. Because of the high plasma density generated by the MUT magnetron, it enable chamber operation in two different modes, deposition and etch back mode. During film deposition, the MUT magnetron supports self-sustained sputtering with a metal plasma without any argon needing to be supplied. During deposition, high DC power applied to the target, for example, greater than 30 kW for a 300 mm wafer, and medium AC bias on the wafer, for example 200 to 1000 W, produce good bottom and sidewall coverage of the deposited metal. During the etch mode, the MUT magnetron supports a high-density plasma of argon supplied into the chamber. During etching, the DC power is lowered to less than 15 or 20 kW. A typical operation occurs at 4 to 8 kW at low argon pressure. The argon ions generated in the plasma may be guided to the wafer for etching with the help of auxiliary magnetic field generated near the chamber sidewalls. Also during etching, the wafer bias power at 13.56 MHz is low, less than 800 W.

Figure 16:
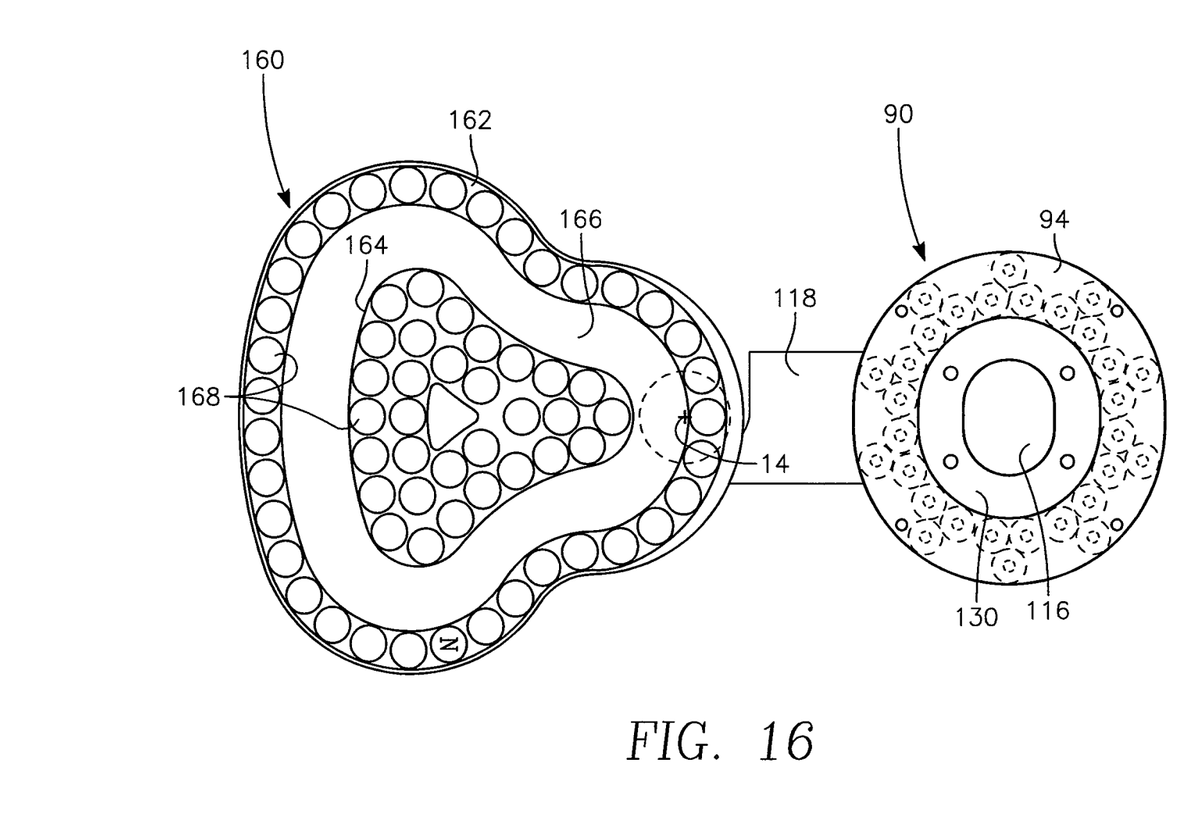
FIG. 16 is a bottom plan view of a rotation arm mounting the source magnetron of FIG. 6 and an auxiliary magnetron.

The auxiliary magnet for tailoring the guidance field may be in the form of a balanced or nearly balanced magnetron 160 illustrated in the bottom plan view of FIG. 16, which may be mounted on the same rotation arm 118 of FIG. 9, but generally on the opposite side of the rotation center 14 from the source magnetron 90 and it may eliminate the need for the counterweight 124. The balanced magnetron 160 of FIG. 16 includes an outer pole piece 162 of surrounding an inner pole piece 164 with a closed gap 166 between them. In the illustrated embodiment the outer pole piece 162 overlies the rotation axis 14 and extends radially over a greater distance than does the source magnetron 90. A gap 166 between the pole pieces 162, 164 approximately defines the plasma track the magnetron 160 creates. It extends from the rotation center 14 across the entire area swept by the gap 130 of the source magnetron 90. The gap 168 of the auxiliary magnetron 160 has a rounded generally triangular shape having a convex shape on its radially outer side and a concave shape on its two radially arranged sides and three rounded corners.

A nearly equal number of magnets 168 of opposed polarities are mounted to the two pole pieces 162, 164 by a mechanical structure similar to that of FIGS. 6-8. The magnets are of substantially equal size and strength so that in the illustrated embodiment the imbalance ratio between the outer and inner poles is 39/31=1.3. The imbalance ratio is preferably maintained below 1.5. The magnet polarities are chosen so that the magnetic polarity of the pole piece 94 of the source magnetron 90 is the same as the magnetic polarity of the outer pole piece 162 of the balanced magnetron 160. The width of the gap 166 in the balanced magnetron 160 is larger than the gap 130 in the source magnetron 90 so that the magnetic field in the gap 166 of the auxiliary magnetron 160 is smaller, creates a smaller plasma density, and less readily supports a plasma at lower pressure. One of the present inventors Gung describes a similar structure in U.S. Patent Application Publication 2006/0060470, now issued as U.S. Pat. No. 7,686,928, and incorporated herein by reference.

The large balanced magnetron 160 is also effective at cleaning the inner portions of the target of any redeposited sputtered material, which tends to flake off after extended target usage. This cleaning may be performed at higher argon chamber pressure which supports a plasma in the balanced magnetron 160 while the sputter deposition is primarily performed at lower pressures or in the SSS mode in which only the source magnetron 90 supports a plasma.

Figure 17:
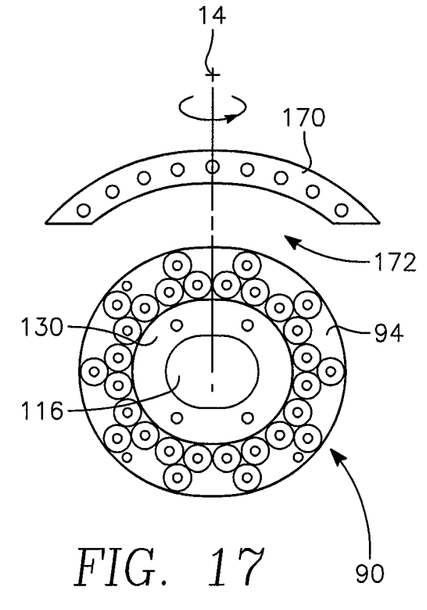
FIG. 17 is a bottom plan view of the source magnetron of FIG. 6 and a auxiliary magnet arced array.

An alternative configuration for the auxiliary magnet, illustrated in the bottom plan view of FIG. 17 includes an arc-shaped magnet array 170, which may be mounted on the same rotation arm 118 between the rotation center 14 and the source magnetron 90. The magnet array 170 is populated with magnets having the same magnetic polarity as those of the outer pole piece 94 of the source magnetron 90 and preferably has a shape following that of the pole piece 94 so that a gap 172 of approximately constant width is formed between them. The arc-shaped magnet array 170 may be formed of two arc-shaped pole pieces capturing its magnets between them. The magnet array 170 does not operate as an effective magnetron so full-face erosion may be nonetheless achieved by using a two-position magnetron, such as described by Miller et al. in the previously cited patent application.

Figure 18:
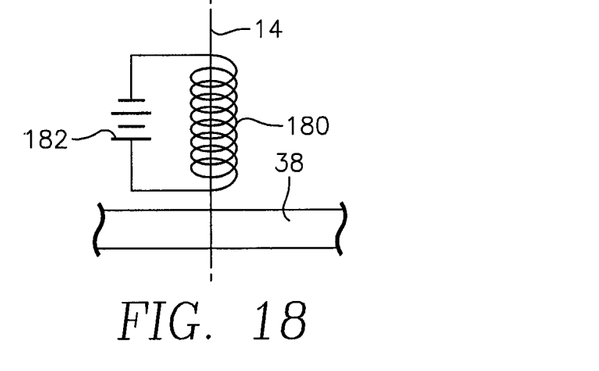
FIG. 18 is a schematic side view of an auxiliary electromagnet placed in back of the sputtering target.

A yet further alternative for the backside magnet, as illustrated in the schematic cross-sectional view of FIG. 18, includes an electromagnetic coil 180 positioned in back of the target 38 in a radial position inward from the source magnetron and preferably powered by a DC power supply 182. If the coil 180 is wrapped around the central axis 14 but separated from the rotation shaft 62, the mechanical and electrical design is simplified.

Figure 19:
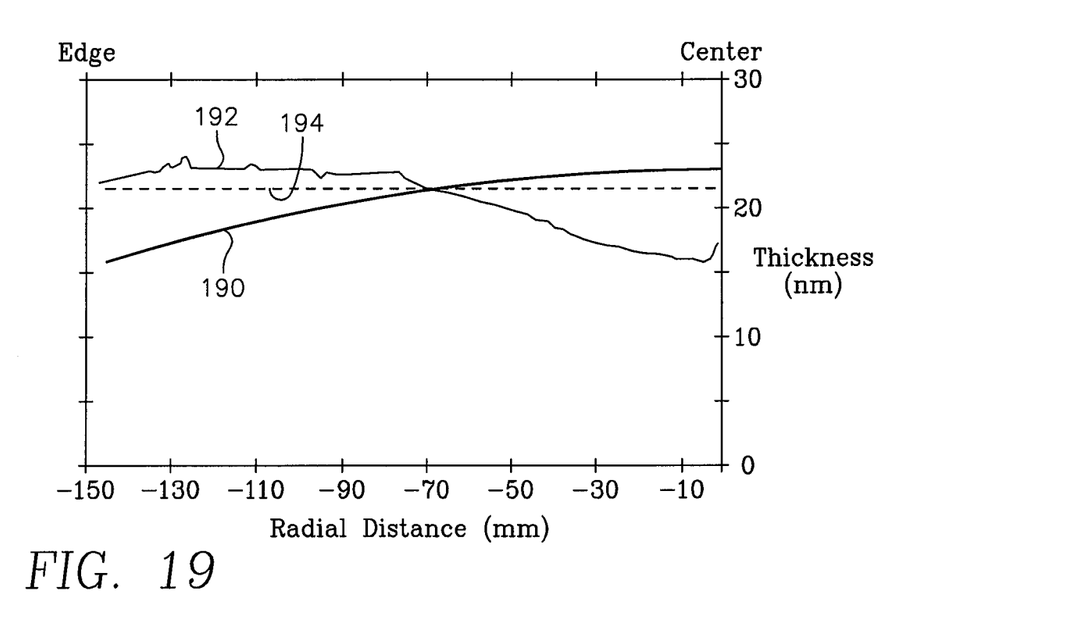
FIG. 19 is a graph of experimental data illustrating the redistribution of metal ions by use of an auxiliary magnet.

Even at zero wafer bias, without the use of the auxiliary magnet or magnetron in back of the target, as illustrated in the graph of FIG. 19, a center-heavy sputter deposition profile 190 is usually obtained. The use of auxiliary magnets or magnetrons in back of the target may produce a center-light deposition profile 192 with zero wafer bias. Proper optimization between the source magnetron and the auxiliary back-of-target magnets and optionally with the use of auxiliary sidewall magnets or electromagnets allows an essentially flat deposition profile 194.

Figure 20:
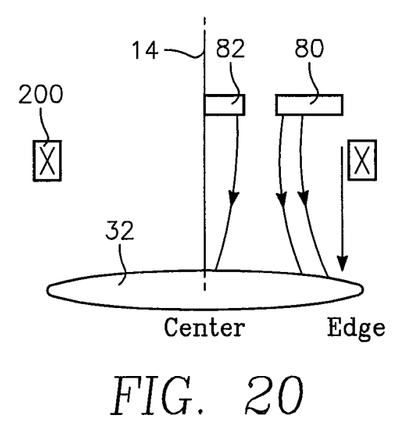
FIG. 20 is a schematic side view of a source magnetron in combination with a center auxiliary magnet and a sidewall electromagnetic coil.
Figure 21:
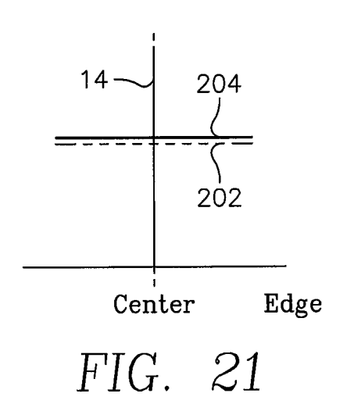
FIG. 21 is a graph illustrating the ion flux profile obtainable with the magnet system of FIG. 20.

The auxiliary magnet or magnetron in back of the target may be augmented, as illustrated in the schematic illustration of FIG. 20 by one or more auxiliary sidewall electromagnets 200 wrapped around the central axis, typically outside the chamber wall, or similarly by an annular sidewall array of permanent magnets. Both have the effect of creating a magnetic barrier adjacent the chamber wall to prevent the plasma from diffusing to the wall. As a result, the auxiliary sidewall magnets increase the ion flux profile, as illustrated in the graph of FIG. 21, from a lower flat ion flux profile 202 to a higher flat ion flux profile 204. These auxiliary sidewall magnets are preferably mounted in the upper half or upper third of the chamber between the wafer 32 and the target 38.

Figure 22:
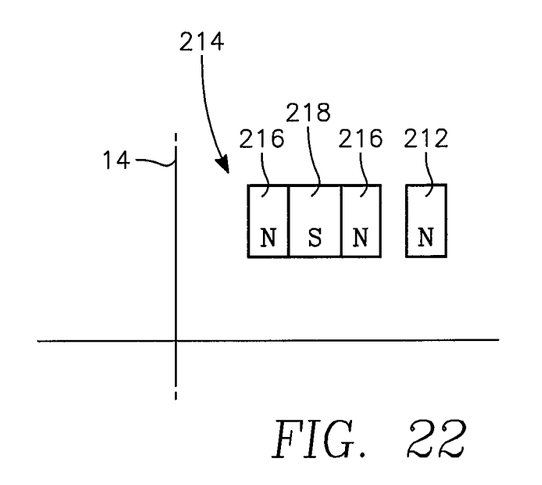
FIG. 22 is a schematic side view of a magnetron and an auxiliary magnet positioned radially outside of it and rotating with it about a central axis.

Another auxiliary magnet to guide the ions sputtered adjacent the source magnetron is an outer auxiliary magnet 212, illustrated in the schematic diagram of FIG. 22, which is positioned radially outside of a source magnetron 214 relative to the central or rotation axis 14. It has a vertical magnetic polarity aligned with that of an outer surrounding pole 216 of the source magnetron 214, which also includes an inner, surrounded pole 218 of substantially less total magnetic intensity than that of the outer pole 216. The outer auxiliary magnet 212 advantageously rotates with the source magnetron 194 about the central axis 14. The outer auxiliary magnet 212 can be used to push ions during deposition also and to improve the etch symmetry by increased ionization and improved guidance of the metal ions.

Figure 23:
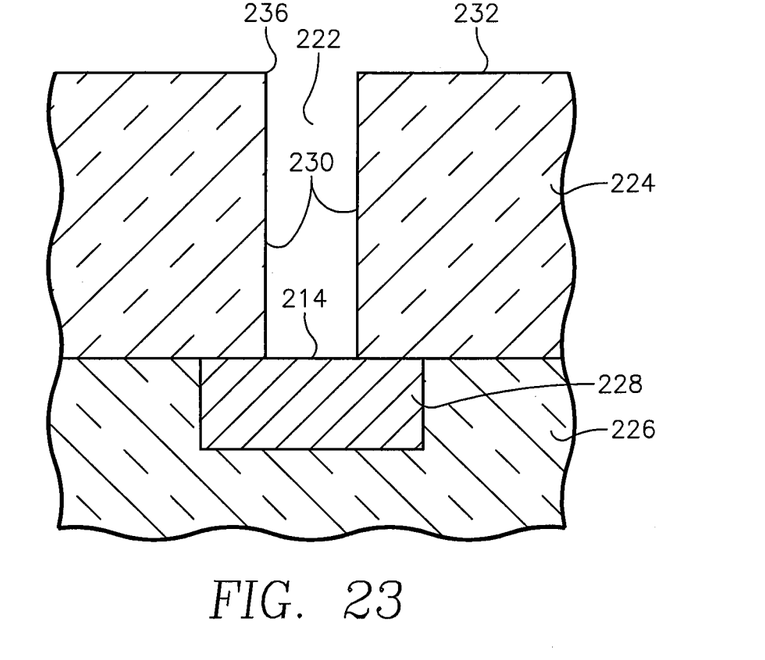
FIG. 23 is a cross-sectional view of a interlevel via prior to lining and filling.

The invention may be applied, as illustrated in the cross-sectional view of FIG. 23, to depositing a barrier liner in a via 222 etched through an upper dielectric layer 224 overlying a lower dielectric layer 226 having a conductive feature 228 formed in its surface underlying the via 222. The eventual structure includes copper filled into the via 222 to provide a vertical electrical connections through the upper dielectric layer 224 to the conductive feature 228. The barrier layer prevents the migration of copper into the dielectric layer 224. Copper metallization is typically performed on a dual-damascene structure in which one or more vias are formed in the bottom portion of the dielectric layer 224 and a larger horizontally extending trench is formed in the upper portion of the dielectric layer 224 to connect multiple vias or provide for more general horizontal interconnections or large contact pads. Copper is filled into the vias and trenches in a single set of operations, which will be explained only in the context of the single via 222 of FIG. 23. The conductive feature 228 in the lower dielectric layer 228 may be the copper-filled trench of a lower metallization structure.

The barrier needs to cover sidewalls 230 of the via 222 and preferably also cover a planar field region 232 on top of the upper dielectric layer 224. Barrier materials, such as ruthenium tantalum and its nitride, are moderate to poor electrical conductors. As a result, it is preferred that the barrier not cover a bottom 234 of the via 222. A sensitive portion of the via structure includes its upper corners 236, which because of their exposed geometry are subject to the formation of overhangs for sputtered material and also subject to a higher degree of sputter etching than the field region 232.

After formation of the barrier layer, the copper metallization is typically formed by coating a copper seed layer onto the sides of the via 222 and over the field region 232. Copper is then filled and overfilled into the via 222 and over the top of the field region 232 by electrochemical plating (ECP). The copper seed layer acts as both a plating electrode and a nucleation layer for the electroplating. However, it is possible that the ruthenium tantalum surface layer of the barrier is sufficiently conductive and wetting to copper that the copper seed layer can be dispensed. After ECP, chemical mechanical polishing (CMP) is used to remove all the copper outside the via 202 (and trenches). A further metallization level including another dielectric layer and metallization structure may then be formed over the lower metallization level.

The invention may be practiced in a multi-step process performed in a single sputter chamber equipped with a RuTa target. A recipe for this process is summarized in TABLE 1 but the inventive process is not limited to the tabulated parameters.

TABLE 1

|  | RuTaN Deposition | RuTa Deposition | Etch Back | RuTa Flash |
|---|---|---|---|---|
| DC Power (kW) | 15-40 | 15-40 | 4-15 | 15-40 |
| AC Bias (kW) | 0.4-1.5 | 0.4-1.5 | 0.6-1.5 | 0-1 |
| Ar Process (sccm) | 0-4 | 0-4 | 4 | 0-4 |
| N$_2$ Process (sccm) | 4-100 | 0 | 0 | 0 |
| Ar Backside (sccm) | 4 | 4 | 4 | 4 |

In the process, argon is supplied both as a process gas and as a backside thermal transfer gas. It is assumed that the backside gas eventually flows into the chamber to join the process gas. The plasma is struck at an argon pressure of about 750 milliTorr. Thereafter, the chamber pressure is less than 500 milliTorr.

Figure 24:
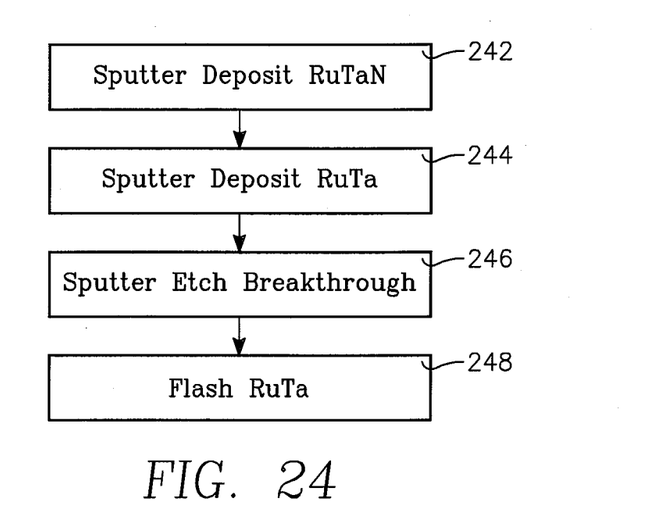
FIG. 24 is a process flow diagram for lining a via according to another aspect of the invention.

In step 242 of the process flow diagram of FIG. 24, ruthenium tantalum nitride is reactively sputter deposited under conditions favoring a high ionization fractions of the metal ions, such as high target power, and strong wafer biasing so as to draw the metal ions deep within the narrow via. The reactive sputtering is performed in an ambient of nitrogen gas and, once the plasma has been ignited, the supply of argon may be substantially reduced or even stopped. In step 244, metallic ruthenium tantalum is sputter deposited with conditions similar to those of step 242 except that nitrogen is no longer supplied. Steps 242, 244 effect the deposition of a RuTa/RuTaN barrier over the via sidewalls and typically also on the via bottom. Some believe that metallic ruthenium tantalum alone provides a sufficient barrier so that step 242 may be eliminated.

It is desired to remove the bottom barrier because is overlies the conductive feature being contacted and increases the contact resistance. Accordingly, in a breakthrough etch step 246, argon sputter etching of the wafer is performed until the bottom barrier is removed. This step is performed with a high argon pressure in the chamber, low target power, and high wafer biasing so that the argon ions are drawn at high energy to the bottom of the via. If the sputter chamber is equipped with an RF coil, the coil excites the plasma rather than the target. The breakthrough etch step 246 does not significantly etch the barrier on the sidewalls but selectively etches the bottom of the via because of the anisotropic flux of accelerated argon ion. However, it also significantly etches the field area and even more so the corners of the via, thus exposing possibly exposing the underlying dielectric in the field area and particularly the corners. To assure some barrier over all dielectric regions, a flash step 248 deposits a thin layer of ruthenium nitride under conditions favoring a neutral and isotropic sputter flux, which preferentially coats the field region and the corners but is less effective in coating inside the via. This process follows one of the processes described by Wang in the U.S. patent application Ser. No. 11/511,869, filed Aug. 29, 2006, but the embodiment described above does not rely on an RF coil for the breakthrough etch step 246.

The inventive magnetron, particularly in combination with an auxiliary magnet or magnetron, allows the effective deposition of many materials including the commercially important tantalum, ruthenium, and alloys thereof. However, the magnetron and auxiliary magnet each provide advantageous features of their own independent of the other.

The invention claimed is:

1. A magnet system for a plasma sputter chamber, comprising:
   a source magnetron having
      an outer magnet assembly comprising magnets of a first magnetic polarity that is oriented along a first direction and
      an inner magnet assembly comprising at least one magnet of an opposed second magnetic polarity that is oriented opposite the first direction, surrounded by the outer magnet assembly, and separated therefrom by a closed first gap,
   wherein a first ratio of the magnetic strength of the outer magnet assembly to the magnetic strength of the inner magnet assembly of the source magnetron is at least three, and
   wherein the source magnetron is rotated in back of a target assembly about the central axis; and
   an auxiliary magnetron disposed away and spaced from an outer side of the source magnetron in a second direction from the inner pole toward the central axis, overlying the central axis, and having an outer magnet assembly comprising magnets of the first magnetic polarity that is oriented along the first direction, surrounding an inner magnet assembly comprising at least one magnet of the second magnetic polarity that is oriented opposite the first direction, and separated therefrom by a closed second gap, wherein the inner and outer magnet assemblies of the auxiliary magnetron have substantially equal magnetic strengths.

2. The system of claim 1, wherein the second gap is wider than the first gap.

3. A magnet system configured to be disposed on a back of a target assembly of a plasma sputter chamber for influencing a production of particles sputtered from a front of the target assembly and consisting of:
- a source magnetron consisting of
  - an outer pole of first magnetic polarity oriented along a first direction and
  - an inner pole of an opposed second magnetic polarity oriented opposite the first direction, surrounded by the outer pole, and separated therefrom by a closed first gap,
- wherein the source magnetron is rotated in back of the target assembly about the central axis; and
- an auxiliary magnet arrangement disposed on an outer side of the source magnetron in a direction from the inner pole toward the central axis, at least partially disposed at a position between the central axis and the outer pole, and consisting of at least one magnet of the first magnetic polarity oriented along the first direction.

4. The magnet system of claim 3, wherein the auxiliary magnet arrangement is spaced outside of and away from the source magnetron.

5. The magnet system of claim 3, wherein the auxiliary magnet arrangement consists of an arc-shaped array of magnets, the array having a shape following a shape of a portion of the outer pole separated therefrom by a second gap.

6. The magnet system of claim 5, further comprising at least one arc-shaped pole piece capturing the magnets of the auxiliary magnet arrangement.

7. The system of claim 1, wherein a second ratio of the magnetic strength of the outer magnet assembly of the auxiliary magnetron to the magnetic strength of the inner magnet assembly of the auxiliary magnetron is less than 1.5.

8. The system of claim 1, wherein the outer magnet assembly of the source magnetron includes a pole piece having a flattened aperture having a major axis between 15 and 20% longer than a minor axis thereof.

9. The system of claim 8, wherein the minor axis is arranged along a radius from the central axis.

10. The system of claim 9, wherein the second gap includes two opposed straight portions extending perpendicularly to the radius.

* * * * *